United States Patent [19]

Ikeda

[11] 4,144,502

[45] Mar. 13, 1979

[54] NEGATIVE FEEDBACK AMPLIFIERS OF PWM-TYPE

[75] Inventor: Yuji Ikeda, Tokyo, Japan

[73] Assignee: Sansui Electric Co., Ltd., Tokyo, Japan

[21] Appl. No.: 845,651

[22] Filed: Oct. 26, 1977

[30] Foreign Application Priority Data

Oct. 30, 1976 [JP] Japan .............................. 51-146209[U]

[51] Int. Cl.² .......................... H03F 3/217; H03F 3/38
[52] U.S. Cl. ................................... 330/207 A; 330/10; 330/251
[58] Field of Search ..................... 330/10, 207 A, 251

[56] References Cited
U.S. PATENT DOCUMENTS 3,386,046  5/1968  Myer .......................... 330/207 A X
4,059,807  11/1977 Hamada ................................. 330/10

*Primary Examiner*—Lawrence J. Dahl
*Attorney, Agent, or Firm*—Harris, Kern, Wallen & Tinsley

[57] ABSTRACT

A negative feedback operation of a PWM-type amplifier is stabilized by the use of a resistor. The input signal is voltage-compared with the triangular wave of a higher frequency than the input signal to form a PWM-signal, which is, in turn, power amplified and is provided to a load after demodulated by a low-pass-filter. A part of the output voltage is fed back from a common connection point of an inductor and a capacitor of an LC-filter forming the low-pass filter. A resistor is connected in series with the capacitor, and the negative feedback operation is, thereby, stabilized.

3 Claims, 8 Drawing Figures

NEGATIVE FEEDBACK AMPLIFIERS OF PWM-TYPE

BACKGROUND OF THE INVENTION

This invention relates to negative amplifiers of a pulse width modulated (PWM) type, and, in particular, to such amplifiers with stabilized feedback operation.

A known amplifier of such a type generally has a circuit formation as shown in FIG. 1. The input signal is voltage-compared at a voltage-comparator 2 with a triangular wave signal from a triangular wave generator 1 after being added a negative fed-back signal. The triangular wave has a higher frequency than the input signal to be amplified. Therefore, a PWM signal is provided from the voltage-comparator 2. The PWM signal is power amplified at a pulse amplifier 3, the output from which is demodulated at a low-pass-filter 4 to provide an amplified signal to a load 5. A part of the output voltage is fed back through a negative feedback circuit 6.

In this case, the negative fed-back signal is taken out from a point in the filter 4, not the output point of the amplifier 3, because the output of the amplifier includes a high voltage pulse wave component.

The low-pass-filter is one of a lumped constant circuit type comprising at least one stage LC-filter. The fed-back signal is taken out from a common connection point of an inductor and a capacitor of the LC-filter.

FIG. 2 shows a circuit of two stage LC-filter comprising inductors $L_1$ and $L_2$ and capacitors $C_1$ and $C_2$, the load 5 being also shown.

The PWM-type amplifier can be equivalently represented as shown in FIG. 3, wherein triangular wave generator, voltage comparator and pulse amplifier are represented by an amplifier A, because it is thought to be similar as a linear amplifier, except the formation of a PWM-signal. In FIG. 3, this difference is shown as an application of a rectangular pulse energy P at the output of the amplifier A.

Referring to FIG. 3, the low-pass-filter 4 is formed with one stage LC-filter comprising an inductor L and a capacitor C, from a common connection point of which the fed-back signal is taken out.

Now, the stability of the feedback loop will be stimulated, using Nyquist diagram thereof.

Assuming the input signal voltage $V_i$, the resistance $R_L$ of the load 5, the feedback factor (or the ratio of voltage fed-back/output voltage) $\beta$ of the feedback circuit 6, the fed-back signal voltage $V_F$, the voltage gain A of the amplifier A, and values L and C of the inductor L and the capacitor C, the transfer function of the open loop from the input terminal $T_i$ to the output of the feedback circuit 6 is given by following equation;

$$V_F/V_i = A \cdot \beta 1/CLR_L S^2 + LS + 1 \ldots \quad (1)$$

, where S is a complex frequency used in Laplace transformation.

Since $A \cdot \beta$ can be considered as a real number in practical use, the vector locus of the equation (1) is drawn as shown in FIG. 4. Referring to FIG. 4, it is noted that the circuit in FIG. 3 is not stable, although does not oscillate, because the locus passes closely near the point $(-1, jO)$. Furthermore, it will be noted that the transfer function of the closed loop has a peak, or is represented as a transfer function of the second order.

Therefore, the negative feedback operation is not stable in the known PWM-type amplifier.

SUMMARY OF THE INVENTION

An object of this invention is to provide a negative feedback amplifier of a PWM-type which is stable.

Another object of this invention is to realize above object with a simple circuit formation.

A feature of this invention is to connect a resistor in series with a capacitor of a low-pass-filter from which a fed-back signal is taken out.

According to this invention, a negative feedback amplifier of a PWM-type comprises a triangular wave generating means for generating a triangular wave having a higher frequency than an input signal to be amplified, a voltage comparing means for comparing the triangular wave with a resultant signal of the input signal and a fed-back signal to form a PWM signal, and a pulse amplifier means for power amplifying the PWM signal. The amplified PWM signal is demodulated at a low-pass-filter and the demodulated signal is provided to a load.

A part of the output is taken out from a point in the low-pass-filter and negative fed-back.

The low-pass-filter is formed with at least one LC-filter. The fed-back signal is taken out from a common connection point of an inductor and a capacitor of the LC-filter. In the use of a plurality of cascaded LC-filters, the fed-back signal may be preferably taken out from a first stage LC-filter in view of the stability of the negative feedback operation.

In either case a resistor is connected in series with a capacitor of the LC-filter from which the fed-back signal is taken out, thereby to stabilize the negative feedback operation.

Further objects, features and technical merits will be understood from following descriptions of preferred embodiments of this invention referring to the annexed drawings.

DETAILED DESCRIPTION OF PREFERRED EMBODIMENTS

Figure 3:
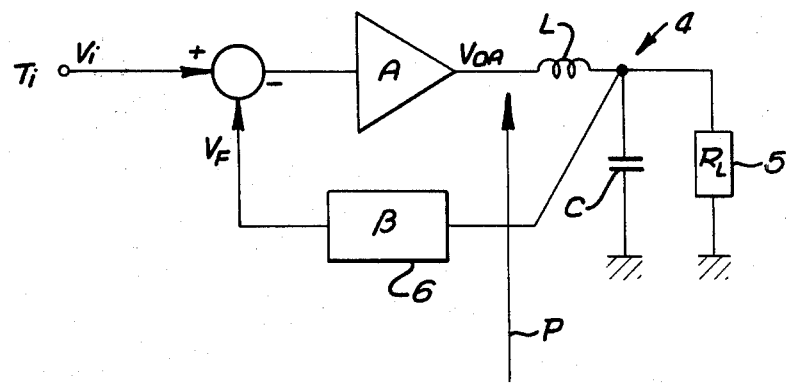
FIG. 3 is an equivalent block diagram of a known negative feedback amplifier of a PWM-type as shown in FIG. 1, for explaining the stability of the negative feedback.
Figure 4:
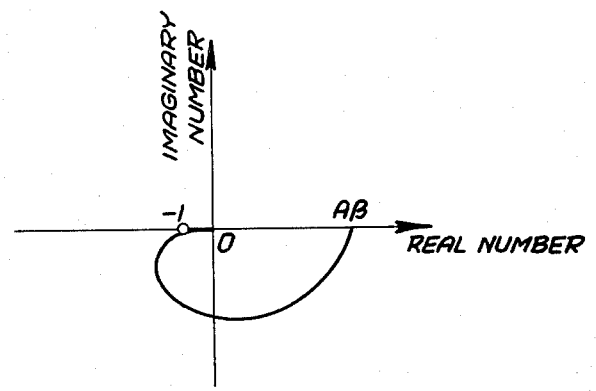
FIG. 4 shows a vector locus of a transfer characteristic of an open loop from the input terminal to the output of the feedback circuit.
Figure 5:
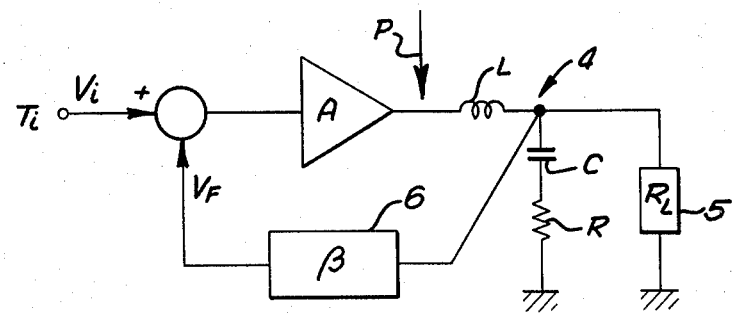
FIG. 5 shows an embodiment of this invention, which is shown in a similar form as FIG. 3.

Referring to FIG. 5, in which an embodiment is shown in an equivalent block diagram form, the shown embodiment is similar as the known negative feedback amplifier of a PWM-type as shown in FIG. 3, except that a resistor R is connected in series with the capacitor C of a low-pass-filter 4 of an LC-filter. Similar parts are represented by same reference characters as in FIG. 3.

In FIG. 5, a fed-back signal is taken out from a common connection point of the inductor L and the capacitor C.

Assuming the value R of the resistor R, a transfer function of the open loop from the input terminal $T_i$ to the output of the feedback circuit 6 is expressed by following equation;

$$V_F/V_i = A \cdot \beta R_L(1+CRS)/CL(R+R_L)S^2+(L+CRR_L)S+R_L \quad (2)$$

Figure 6:
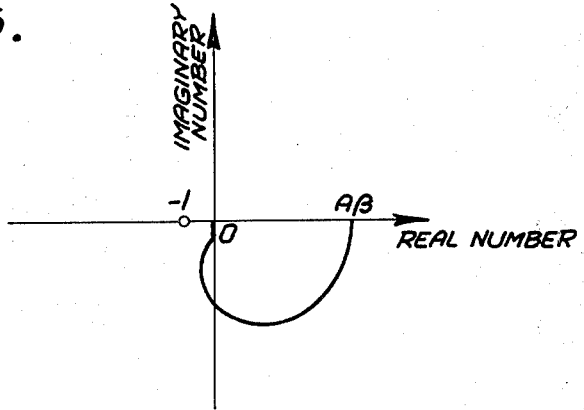
FIG. 6 shows a vector locus similar as FIG. 4 but in FIG. 5.

The vector locus according to the equation (2) is as shown in FIG. 6. As will be noted from FIG. 6, the circuit in FIG. 5 is stable, because the vector locus is not only far apart from a point $(-1, jO)$ but also does not enclose the point. And it can be realized that the transfer function of the closed loop does not have any peak by the selection of the value of the resistor.

The provision of a resistor R will be noted that to badly affect the property of the low-pass-filter 4, if the resistor R is selected to meet a condition $R << R_L$.

While, the transfer function of the closed loop in the embodiment in FIG. 5 is a function of the secondary order, but it is substantially represented as a function of the first order for the high frequency operation. Therefore, a stable feedback operation is realized.

In the high frequency operation, the reactance of the capacitor C is very small and can be substantially ignored. Accordingly, the circuit in FIG. 5 is equivalently represented by a circuit as shown in FIG. 7.

Figure 1:
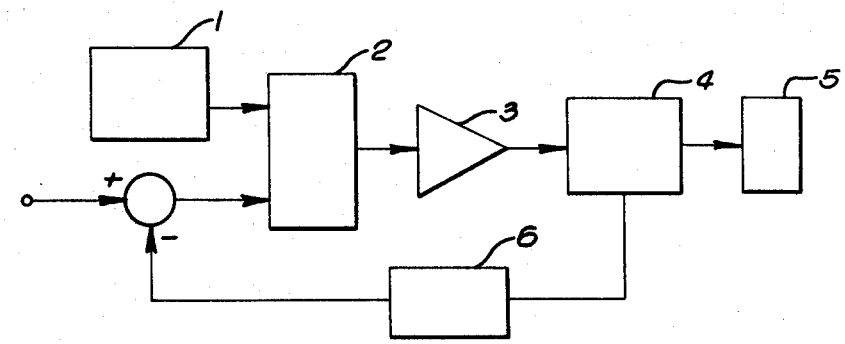
FIG. 1 is a schematic view of a block diagram of a negative feedback amplifier of a PWM-type.
Figure 2:
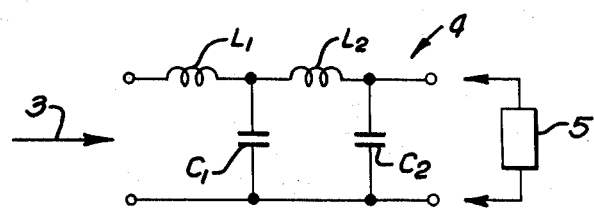
FIG. 2 shows a circuit of two stage LC-filters for a low-pass-filter in FIG. 1.
Figure 7:
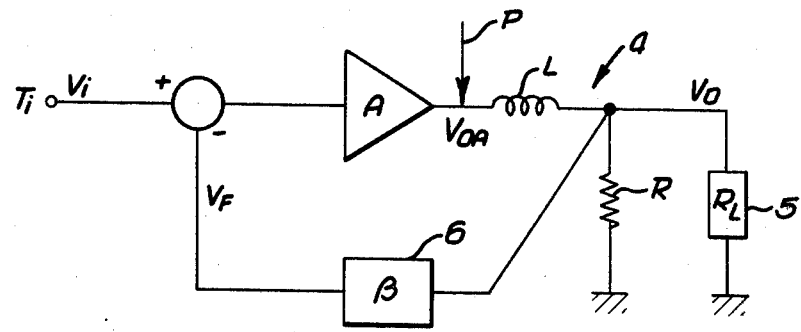
FIG. 7 shows an equivalent circuit of the embodiment in FIG. 5 for the high frequency operation.

Referring to FIG. 7, the inductor L of the filter 4 and the resistor R form an integration circuit. While, the output $V_{OA}$ of the amplifier A is, in practice, a high frequency rectangular pulse signal, because of the application of the high frequency rectangular pulse component P. Therefore, the fed-back signal includes a high frequency triangular wave, which is compared with the triangular wave from the triangular generator (1, in FIG. 1). But since the triangular wave component in the fed-back signal is remarkably smaller in the amplitude than the output from the triangular wave generator, it does not cause any distortion of the output of the PWM-type amplifier in practical use.

Figure 8:
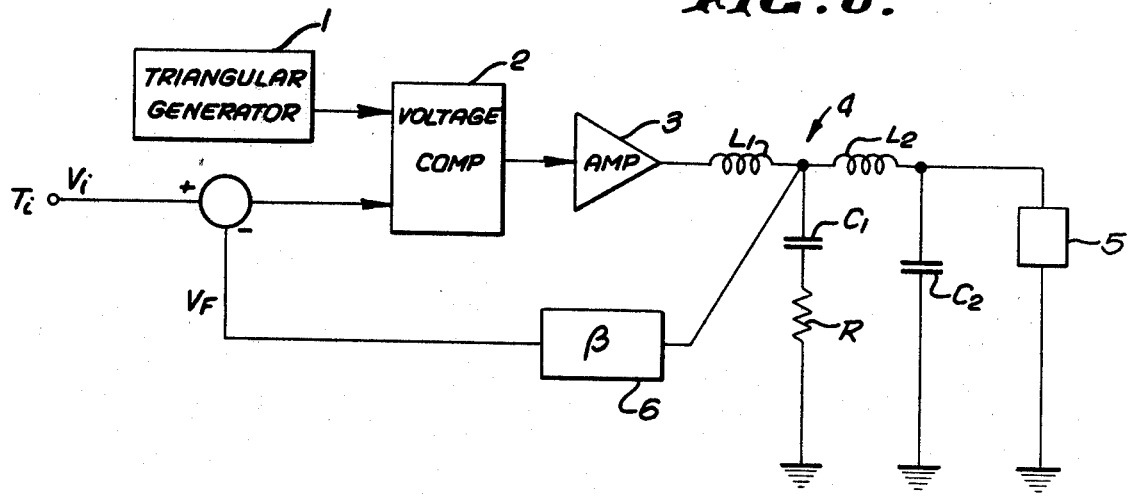
FIG. 8 shows a schematic view of a block diagram of another embodiment.

FIG. 8 shows another embodiment that this invention is applied to a PWM-type amplifier having a low-pass-filter which is formed with two stages of LC-filters. Similar parts are represented by same reference characters as in FIG. 1.

In the embodiment, the fed-back signal is taken out from a common connection point of an inductor $L_1$ and a capacitor $C_1$ of a first stage LC-filter. And a resistor R is connected in series with the capacitor $C_1$.

In this embodiment, the transfer function of the open loop $(V_F/V_i)$ is represented in a considerably complexed form in comparison with the equation (2), because of the existence of an inductor $L_2$ and a capacitor $C_2$. But, it will be noted by those skilled in the art that the vector locus of the transfer function is apart from the point $(-1, jO)$, comparing the case of the non-use of the resistor R. Therefore, this embodiment also realizes the stable negative feedback operation.

In a PWM-type amplifier having a plurality of stages of LC-filters, it is known that the fed-back signal is preferably taken out from a first stage LC-filter in view of the stability of the negative feedback operation. The stability is graded up by the application of this invention.

Although the embodiment has been described in conjunction with a negative feedback amplifier of a PWM-type including one or two stage LC-filters for a low-pass-filter, for the simplification of the description, it will be noted that this invention is applicable to such amplifiers having three or more stages of LC-filters, by connecting a resistor in series with a capacitor of an LC-filter from which the fed-back signal is taken out.

In this specification, the term "triangular wave" should be understood to include a "sawtooth wave".

The frequency of the triangular wave is, for example, 500 KHz in actual use for the amplification of an audio signal.

Although this invention has been described in conjunction with preferred embodiments, which are for exemplificaton and to which this invention is not restricted, it will be understood to those skilled in the art that various modification and further designations can be made within the scope of this invention.

What is claimed is:

1. In a negative feedback amplifier of a PWM-type comprising a triangular wave generating means for generating a triangular wave of a higher frequency than that of an input signal to be amplified, a voltage comparing means for comparing the triangular wave with a resultant signal of the input signal and a fed-back signal to form a PWM signal, a pulse amplifier means for power amplifying the PWM signal, a low-pass-filter being formed with at least one stage LC-filter for demodulating the amplified PWM signal from the pulse amplifier means to provide the amplified low frequency signal to a load, and a feedback loop for taking out the fed-back signal from a common connection point of an inductor and a capacitor of the LC-filter to add the signal to the input signal, an improvement comprising a resistor means which is connected in series with the capacitor of the LC-filter from which the fed-back signal is taken out, whereby a stable negative feedback operation is performed.

2. The improvement as claimed in claim 1, wherein said low-pass-filter is formed with only one LC-filter.

3. The improvement as claimed in claim 1, wherein said low-pass-filter is formed with a plurality of stages of LC-filters, said fed-back signal being taken out from a common connection point of an inductor and a capacitor of a first stage LC-filter, and a resistor means being connected in series with the capacitor.

* * * * *